Oct. 3, 1967 M. L. BLOCK ET AL 3,345,158

ELECTRICAL CONDUCTOR MATERIAL AND METHOD OF MAKING SAME

Filed Aug. 10, 1964

2 Sheets-Sheet 1

INVENTORS
MURRY L. BLOCK
ARTHUR H. MONES

BY Joseph C. Redmond, Jr.

ATTORNEY 3,345,158
Patented Oct. 3, 1967

3,345,158

ELECTRICAL CONDUCTOR MATERIAL AND METHOD OF MAKING SAME

Murry L. Block and Arthur H. Mones, Poughkeepsie, N.Y., assignors to International Business Machines Corporation, New York, N.Y., a corporation of New York Filed Aug. 10, 1964, Ser. No. 388,459
1 Claim. (Cl. 75—108)

This invention relates to an electrical conductor material and a method of preparing same. More particularly, the invention relates to electrical conductors and methods of preparing same for use in microelectronic circuits.

Microelectronic circuits, disclosed in a previously filed application, Ser. No. 300,734 (IBM Docket 14,064), filed Aug. 8, 1963, and assigned to the same assignee as that of the present invention, require conductors and resistors for electrical circuit operation. One form of conductor and resistor material is a paste comprising ceramic and metallic elements that may be deposited by methods such as screening, spraying and dipping or transfer wheel systems. In mass production manufacture of circuits, it is especially important that consistency by obtained in reproducing resistors and conductors over a wide range of magnitudes. Additionally, the resistors and conductors must be stable, reliable and similar in electrical characteristics. Drift and wide scattering in resistance and temperature coefficient of resistivity (hereinafter designated TCR) are presently experienced in preparing resistors based on these compositions. Lack of solderability and uniformity of reproducibility are experienced in preparing conductors based on these materials. These difficulties in the pastes reduces circuit yields which result in increased circuit cost.

One factor found to influence the paste characteristic is crystallite size or surface area of the metal particles in the composition. Before further discussion of this phenomenon, it is believed in order to define a crystallite and surface area.

In solids, atoms are arranged in regular arrays called crystals. The three most common crystal structures found among metals are face-centered cubic, body-centered cubic or hexagonal-closed packed lattices. When the periodicity of the pattern extends throughout a certain piece of material, a single crystal is defined. When the periodicity of the material is interrupted, a polycrystalline material is defined. Metals are an example of a poly-crystalline material, each crystal therein being termed a crystallite. Associated with each crystallite is a surface area enclosing the volume of the crystallite. The interface of crystallite with neighboring crystallites establishes a grain. The terms crystallite and grain are often used interchangeably.

Maintaining the surface area of crystallites or grains within particular ranges has been found to provide metal-ceramic paste with stability, uniformity and consistency in reproducing electrical and topological characteristics. Each selected range will provide unique electrical and other characteristics by virtue of the grain boundary contact. An explanation for this phenomenon is disclosed in a previously filed application, Ser. No. 331,534 (IBM Docket 14,031), filed Dec. 18, 1963 and assigned to the same assignee as that of the present invention. The cited application also discloses a method of preparing ceramic-metal paste of various surface areas. The present invention is an improvement on the cited application and is directed to providing metal conductors of various surface areas by another method of preparation. The metal conductors of the present invention are more consistently realized, as a result of the method. Accordingly, the yields of the present conductors are higher with resultant lower fabrication costs for microelectronic circuits.

A desired surface area for metallic crystallites is usually obtained by selection of sufficiently small crystallite and thermally growing same to the desired size. Thermal growth of crystallites is described in any well-known text, as for example, "Metallurgy for Engineers" by J. Wolff, H. Taylor and A. Shaler published by John Wiley & Sons, Inc., 1952, page 40. Thermal crystallite growth processes, however, are difficult to control for uniformity in electrical and other properties of the metal. Non-uniform distribution in starting crystallite sizes; unequal heat distribution in the growth process and other factors result in metallic elements of varying thermal histories. Electrical and other properties, as a result, are usually different for metallic elements prepared in different process runs. Accordingly, little or no consistency is realized in resistor and conductor fabrication based upon metallic elements thermally grown to a desired surface area or crystallite size.

A general object of the present invention is an electrical conductor material and method of making same which are consistently reproducible by non-thermal means for a relatively wide range of surface areas or crystallite sizes.

One object is an electrical conductor having crystallites of readily controllable surface areas with substantially no thermal history.

Another object is a "wet" process for preparing metallic elements having crystallites of controlled surface areas.

Another object is a process for preparing metal particles having crystallites of variable surface area depending upon easily and accurately controllable process parameters.

Still another object is a process for preparing a complete ceramic-electrode or resistor composition of controlled crystallite size.

A specific object is an electrical conductor of substantially no thermal history prepared by a "wet" process, whereby a selected grain may be consistently reproduced by easily and accurately controllable process parameters.

These and other objects are accomplished in accordance with the present invention, one illustrative embodiment of which comprises the steps of preparing a mineral acid solution of a desired metal, typically a noble metal from a group consisting of palladium, platinum, gold and silver, the mineral acid, typically being a non-halogen acid, for example, nitric acid. The metal-acid solution is adjusted to a desired hydrogen ion activity or pH, after which, a dispersing agent is added while the metal-acid solution is constantly stirred. An organic reducing agent, typically hydrazine, formic acid or the like of selected concentration, is added to the neutralized solution which has been adjusted to a preselected temperature. The organic acid, in one case, is added in discrete units at selected time increments for constancy in reaction activity. The noble metal in solution is precipitated during the reaction. The solution is filtered, leaving a residue of metal particles which are washed and cleaned. Each metal particle comprises a plurality of crystallites each of a surface area determined in accordance with the original metal characteristics, neutralization, dispersing agent, reaction temperature and organic reducing agent. The metal particles, after oxidation in air at about 750° C., are combined with glass frit, silver and an organic carrier for screen or like deposition on a substrate. The screened composition and substrate are fired at about 800° C., to form a resistor or conductor depending upon the process parameters.

One feature of the invention is a metal useful in fabricating conductors and resistors of uniform reproducibility, the metal being obtained by a "wet" process of chemically reducing the metal under controlled conditions of temperature, pH and reductant to obtain crystallites of selected surface area.

Another feature is an electrical conductor material that is consistently reproducible by dissolving the material in a mineral acid and reducing the material from the solution at a selected surface area by the rate of reaction as determined by the solution temperature, pH, dispersant and concentration of the reductant.

Another feature is adjusting the solvated size of metal ions in solution by selection of a desired pH whereby different additions of reductant will cause different rates of nucleation, the initiation of a phase transformation at discrete nuclei (the first structurally stable particle capable of initiating crystallization of a phase) and hence, different surface areas of crystallite sizes.

Another feature is adding the reductant to a metal solution after a boiling temperature has been achieved, whereby the additions of reductants having a high heat reaction cannot raise the temperature of the metal solution beyond the boiling points thereof with resultant effect upon the rate of nucleation in the reaction.

Another feature is the selection of an inert organic reducing agent for initiation of a precipitation reaction, the reduction product of the inert organic reducing agent being either voltalized or readily washed away without any metal residual contamination to the precipitated metal.

Another feature is a dispersing agent added to the metal solution to provide a source of nuclei on which the precipitated metal can grow, an increase in the dispersing agent reducing the surface area by permitting the nucleated crystals to grow to relatively larger sizes.

The foregoing and other objects, features and advantages of the invention will be apparent from the more particular description of preferred embodiments of the invention, as illustrated in the accompanying drawings.

Figure 1:
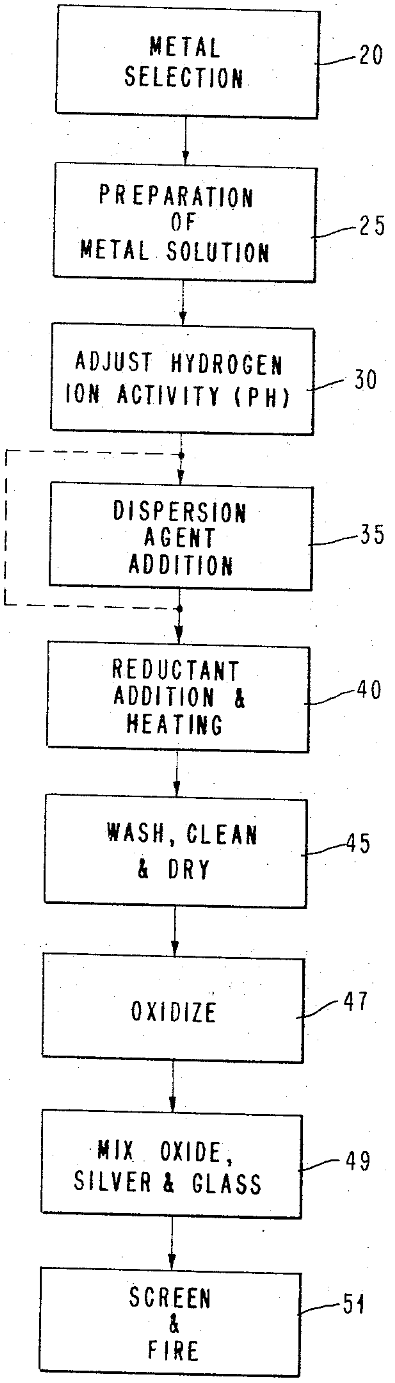
FIGURE 1 is a flow diagram of a process for fabricating conductors and resistors of uniform reproducibility.

Turning now to FIGURE 1, a first step 20 involves the selection of a metal from a group consisting of palladium, platinum, silver and gold as an ingredient in a ceramic-metal composition employed in fabricating conductors and resistors for microminiaturized circuits. The noble metal, usually palladium, is purchased in high purity 99.9%, from any commercial vendor. Typically, but not exclusively, the palladium is of minus 200 mesh and unknown crystallite size. The metal, by procedure well known in the art, is dissolved in a mineral acid, typically a non-halogen acid as an operation 25. Preferably, the palladium is dissolved in a nitric acid solution to the extent of 10 grams of metal per 100 cc. of mineral acid solution. A non-halogen acid has been found to be preferable since rseidual halogens, evidenced in commercially available palladium black, appear to contribute to some of the non-reproducible parameters in the metal. In the case of platinum or gold, however, an aqua regia solution is mandatory because no other desirable acids have been found to dissolve these metals.

As operation 30, the solution, which is very acid, is adjusted to a pH of 1 by the addition of ammonium hydroxide of a high grade of purity. Ammonium hydroxide has been found preferable because the decomposition products are ammonia and water, neither of which adds residual mono or multivalent ions to the solution, thereby interfering with eventual processing of the metal. Typically for 1000 cc. of metal solution, 225 cc. of ammonium hydroxide are added. The pH is adjusted to one (1) using a conventional pH meter including an automatic temperature compensation feature. The solution is filtered through an analytical grade filter paper and readied for the next operation or stored for future use.

Figure 2:
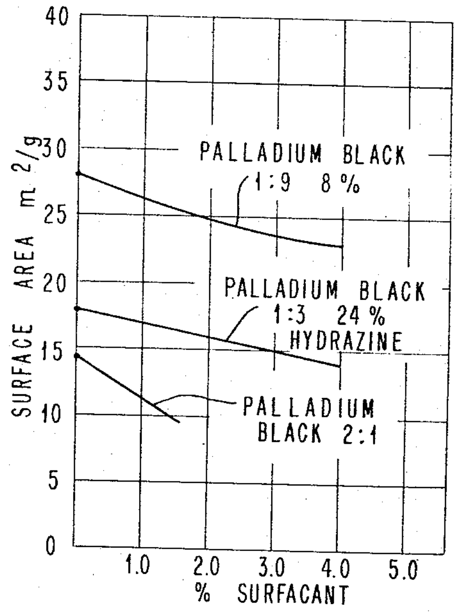
FIGURE 2 is a graph of surface areas in meters square per gram versus percent dispersing agent for various metal-reductant ratios.

A dispersing agent is added to the filtered solution, as operation 35. The dispersant agent, typically a silicone, gelatin or methyl cellulose, is added to the solution in percentage amounts as indicated in FIGURE 2. The dispersant agent is believed to be a source of nuclei on which palladium can grow as removed from the solution by the reductant. The many nuclei permit the various crystals formation to be of relatively large size. The absence of a dispersant agent presumably permits a smaller amount of nuclei with a reduced possibility of forming large crystallites of small surface area. Accordingly, it is possible to perform the process with or without the addition of the dispersant agent based upon desired crystallite size required for the conductors and resistors employed in the microminiaturized circuits. The flow chart, returning to FIGURE 1, indicates by dashed line that operation 35 can be omitted.

The metal solution, of adjusted pH and selected dispersion concentration, is raised to the boiling temperature and diluted with a reductant as an operation 40. The boiling temperature is found to be preferred because it can be maintained at a constant level. The additions of reductants, which have a high heat of reaction, cannot raise the temperature of a boiling solution. Other temperatures may be employed, however, but the temperature rise from the heat of reaction in different process runs may not be entirely reproducible. The heating step is performed by any suitable means. Usually, the boiling temperature is held for five minutes prior to the addition of the reductant.

The reductant for the process is an organic or inorganic material which should be easily removed from the system, preferably by gas evolution. Gas evolution of the excess or decomposed material will minimize residual contaminants in the precipitated metal.

As one reductant, hydrazine of various concentrations, typically 1:3 through 1:27 (anhydrous hydrazine to water) have been found suitable in the present process. Hydrazine, however, has a high heat of reaction and must be added under controlled condition for consistent reproduction of a selected surface area. As one process for adding hydrazine, one cc. of 1:3 hydrazine solution is added every 15 seconds until reduction is complete. Additions of 1 cc. every five seconds have been found satisfactory for very dilute hydrazine solutions. To effect the addition of hydrazine in a controlled fashion, an automatic pipette is used to pulse a fixed amount of reductant per unit of time. The time chosen is of such a period to allow the reaction to subside before the next pulse is added. It should be noted that although certain time rates of hydrazine reductant have been noted, combinations of larger quantities of hydrazine and other time intervals are also possible.

Pulsed addition of hydrazine is performed to avoid mirror formation on the container walls and to contain the reaction within the vessel where one cc. addition of hydrazine would result in uncontrollable reduction with potential material loss.

The reductant precipitates palladium from the palladium-nitrate solution as follows:

$$Pd^{++} \xrightarrow{\text{Hydrazine}} Pd^{0} + 2e^{-}$$

The termination of the reduction is evidenced by a clearing of the supernatant solution. The effect of the hydrazine concentration is noted in FIGURE 2. As the hydrazine concentration is reduced, the surface area of the reduced palladium crystallite is found to be larger. Presumably, the reduced concentrated hydrazine forms a lesser number of nuclei, on which palladium can grow. The dispersant affects each metal solution-hydrazine reaction in a corresponding manner. In both cases the surface is reduced as the percentage of dispersant increases. The graphs indicate that the change in surface area is substantially linear with respect to the increase in dispersant. The resultant crystallites are larger and have reduced surface area for reasons indicated in IBM Docket 14,031, cited above.

A less concentrated reductant solution produces a greater number of nuclei, hence, smaller crystallites and larger surface area. The surface area measurement on the reduced metal was made by gas absorption techniques similar to those described in the text "Fine Particle Measurements" by C. Orr, Jr. and J. M. Dallavalle, MacMillan Co., N.Y., 1959, Chapter 7.

A description of nucleation in precipitate reactions is analagous to the formation of solids as a liquid metal is cooled. A description appears in the Wolff et al. text cited above, pages 42 through 46. Accordingly, a detailed description of the reaction on the present invention will not be given in view of the Wolff et al. text. It is believed apparent that the parameters indicated above, e.g., pH, temperature, dispersant and reductant control the nucleation and crystallite formation.

Figure 4:
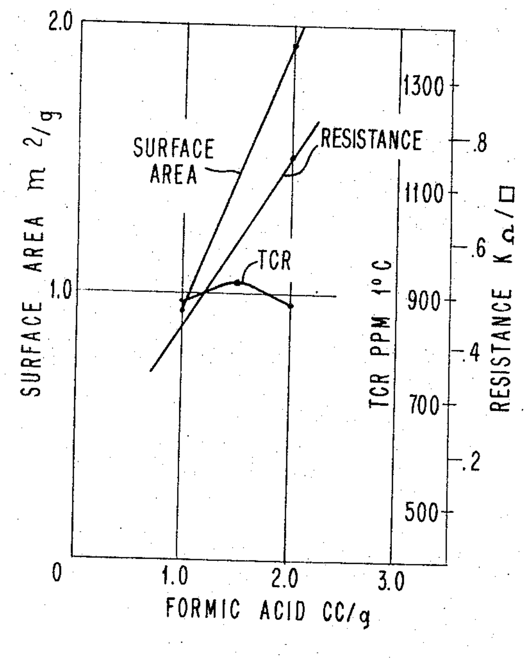
FIGURE 4 is a graph showing the effect upon surface area in meters square per gram; resistivity in kilo-ohms per square, and TCR and p.p.m. per degree C. for various amounts of formic acid used per gram of palladium at a constant pH 1.

As another reductant, formic acid has been found satisfactory. The process is the same as that described for the hydrazine reduction except a dispersant has been found to have only slight effect upon the surface area of the crystallite. Usually, but not necessarily, a dispersant is not employed in the process. Accordingly, operation 35 is omitted for a formic acid process. The induction or reaction time is not immediate for formic acid, as contrasted with hydrazine. The induction time is usually of the order of five minutes, when the solution is at boiling temperature and a pH of 1. The amount of formic acid per gram of palladium is indicated in FIGURE 4. The surface area associated with the formic acid is usually much lower than those corresponding to hydrazine. FIGURE 4 indicates the formic acid reductions have surface areas of the order of three meters square per gram whereas hydrazine reductions have surface areas of 18 square meters per gram (see FIGURE 2).

The reduction of the metal may also be performed with other reducing agents, as for example, formaldehyde, ascorbic acid, and hydroquinone. Detailed description of these reductions will not be given for reasons of brevity.

The precipitated metal is filtered by suction through an analytical grade filter paper, as operation 45. The metal is also washed and cleaned with sufficient deionized water. The residual metal is dried in an oven at 105° C. for an hour.

The final metal will have a surface area or crystallite size formed without any thermal history. The surface area can range from 2 meters square per gram through 40 meters square per gram based upon the pH, reductant concentration, percent dispersant and the initial metal solution.

Although the present invention has described the formation of palladium as an electric conductor material, the process is also suitable for forming platinum, gold and silver crystallites. Platium particles can be combined with bismuth oxide in a suitable non-halogen solution. The platinum can be intimately mixed with the bismuth oxide by and during reduction with a chloroplatinic acid. Accordingly, the invention should not be deemed limited to the particular metals and reductants described in the illustrative embodiment.

For use as a resistor material, the metal is oxidized as operation 47. Oxidization of the metal is done, for example, by heating in air for two hours at 750° C. A standard oven is employed for the oxidation process. The oxidized metal is combined with a finely divided, e.g., 325 mesh, vitreous frit, colloidal silica and silver, as operation 49, the combination being mixed by standard techniques to a desired particle size and 3 roll milled with an organic vehicle to form a paste. The details of the preparation of resistor paste are described in IBM Dockets 14,031 and 14,066, Ser. Nos. 331,534 and 334,544, filed Dec. 18, 1963 and Dec. 30, 1963, respectively. The details for the preparation of a conductor paste is described in IBM Docket 14,066, Ser. No. 334,544, filed Dec. 30, 1963. The conductor uses the precipitated metal without oxidation.

The final step in the process, operation 51, is screening and the firing of the composition on a suitable surface. Briefly, the ceramic-metal paste is squeegeed through a silk screen, having a defined pattern therein, onto a substrate. The screened substrate is fired in an oven at 750° C. for about one hour. The details of the screening and firing operation are also given in the IBM Dockets 14,031, 14,064 and 14,065.

It is also possible to make a combined ceramic-metal composition by the present process. The ceramic material, typically a borosilicate glass, may be added to the metal solution prior to the addition of the reductant. The metal removed from the solution by the addition of the reductant will be intimately mixed in the ceramic. The intimate mixture of ceramic-metal particles, after reduction, may be suitably filtered, washed and dried as in the operation 45.

It is also possible that silver in the form of $AgNO_3$ solution may be included in the metal-ceramic solution. The silver, ceramic and metal would be intimately mixed after the reduction operation 40.

Resistors based on palladium prepared from the process of FIGURE 1, are described in FIGURES 3, 4, 5 and 6. A brief description of these figures is believed in order to indicate the wide range of reproducible resistors obtained from the present invention.

Figure 3:
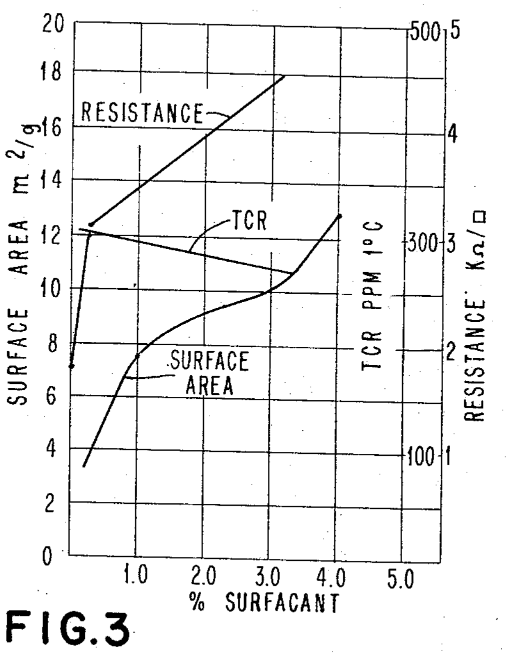
FIGURE 3 is a graph of resistivity in kilo-ohms per square versus percent dispersant for palladium oxide oxidized from palladium black prepared from metal-acid solution using 1:3 hydrazine reductant.

FIGURE 3 shows the range of resistivity for a palladium oxide resistor based on palladium black prepared by the present process in a 1:3 hydrazine reduction and for varying amounts of dispersant. It should be noted that the surface area of the palladium oxide increases with the dispersant whereas the palladium black, as evidenced in FIGURE 2, has reduced surface area with increase in dispersant. Laboratory study suggests that the interaction of the small concentrations of residual silica from the silicone dispersant and palladium during the fabrication of the oxide results in the increased surface area for the palladium oxide by inhibiting its growth.

Turning to FIGURE 4, the range of resistivity and surface area is indicated for a palladium oxide resistor, based on palladium black prepared by varying amounts of formic acid as a reductant in the present process. Both surface area and resistivity are indicated as increasing linearly as the reductant is increased. The surface area, as compared to that for the palladium oxide resistor of FIGURE 3, is of a lesser magnitude. A dispersant has been found to have minimum effect in the metal solution-formic acid reaction, and may be omitted in the process. Accordingly, FIGURE 4 has omitted the dispersant as a parameter in fabricating palladium oxide resistors of desired resistivity.

Figure 5:
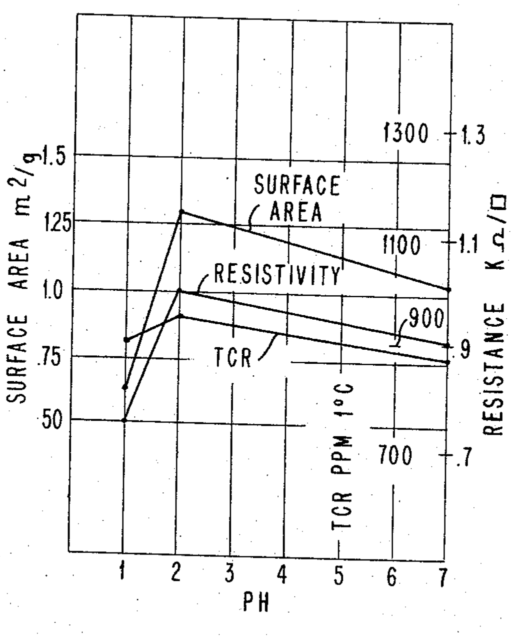
FIGURE 5 is a graph of surface area in meters square per gram; resistivity in kilo-ohms per square, and TCR in p.p.m. per degree C. for metal solutions of constant dilution and pH, reduced by a constant amount of formic acid reductant.

The hydrogen ion activity or pH, however, influences surface area and resistivity of palladium oxide resistors based on palladium black prepared by a formic acid reductant. FIGURE 5 indicates that as the acidity of the metal solution is reduced prior to the addition of the reducant, surface area increases for a limited range and thereafter decreases as the solution approaches neutrality. FIGURE 5 emphasizes that it is of critical importance in the preparation of a resistor to begin the reaction at a selected pH, otherwise variation in surface area and resistivity will occur.

Figure 6:
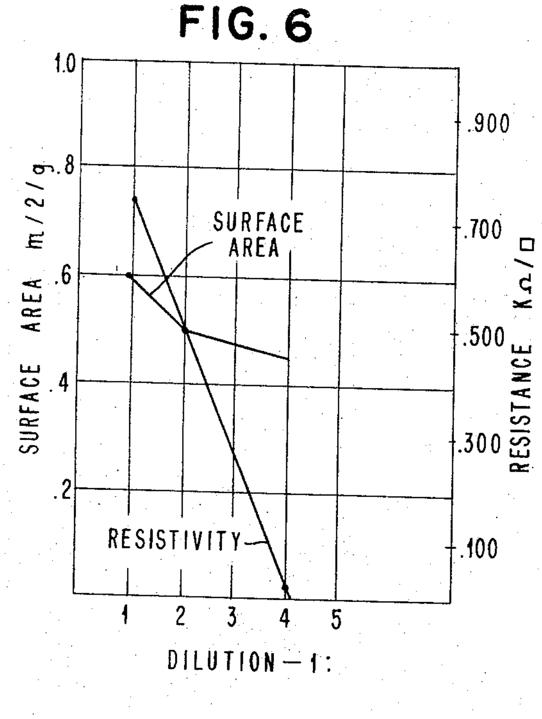
FIGURE 6 is a graph of surface area in meters square per gram; resistivity in kilo-ohms per square, and TCR in p.p.m. per degree C. for various dilutions of metal solutions at a constant pH and formic acid reductant.

The dilution of the palladium solution prior to the neutralization and addition of reductant effects final resistivity and surface area. Referring to FIGURE 6, a palladium nitrate solution of varying dilution at a constant pH and formic acid reductant has decreased surface area and resistivity with increased dilution. FIGURE 6 suggests that the dilution of the metal solution is a process parameter which may offset the effect of the increase in the formic acid concentration as evidenced in FIGURE 4.

Thus, the present process can provide surface areas and hence, resistivities in a rang of values desired by several parameters which may be easily and accurately controlled. Laboratory data indicates that selected surface areas and resistivities may be more readily reproduced as contrasted with thermal processes. This feature is believed to be due in part, at least, to the fewer number of more readily controlled process steps involved in crystallite growth in a "wet" or chemical reducing process as compared to a thermal process. A high degree of atmosphere control, which is of vital importance in the thermal process, is not readily effected. In contrast, a controlled environment in aqueous solution growth is more easily effected.

Table I, hereinafter, sets out the working range and preferred values for the various parameters in the present process.

of row C is in the range of 0 to 5% and 0% is preferred for reasons previously indicated. The dispersant for the hydrazine portion of row D is similar to that indicated for rows A and B.

The following are exemplary of palladium black preparation for palladium oxide resistor and palladium silver conductor, it being understood that the details of the examples are not to be taken as in any way limiting the invention thereto. In all examples any reference to parts, proportions and percentages refer to parts, proportions and percentages by weight unless otherwise specified.

*Example I*

High purity palladium, purchased from a commercial vendor, was combined with nitric acid ($HNO_3$—70% concentrated) to form the starting material. The palladium nitrate solution containing 10 grams of palladium per 100 milliliters of nitric acid was neutralized to a pH of 1 with concentrated, high purity reagent quality ammonium hydroxide ($NH_4OH$—28% concentrated). A pH meter with automatic temperature compensation was employed to obtain a pH of 1. To 300 milliliters of pH 1 metal solution (equivalent to 25 grams of palladium), 2.97 grams of silicone antifoam agent, e.g., a silicone dispersant sold by Dow-Corning, Midland, Mich., as silicone antifoam "B," was added. The solution was heated to boiling prior to the addition of the reductant. A 32% hydrazine ($N_2H_4$) solution was added at 1 cc. per 15 seconds for 8 minutes. The completion of the reaction was indicated by disappearance of color from the solution. A total of 32 cc. of hydrazine was added to the solution during the reduction process. Boiling is maintained during the reduction and for five minutes thereafter. The

TABLE I

| | (1) Surface Area, m.²/gm. | (2) Solution | | (3) Temperature | | (4) pH | | (5) Reductant | | (6) Dispersant, Percent | |
|---|---|---|---|---|---|---|---|---|---|---|---|
| A | 20-30 | 10 g./100 | 0.5 g./100, 20 g./100. | Boiling | Amb.-Boiling | 1 | 0-2 | 10% | 5-15% | 3 | 0-5 |
| B | 10-20 | 10 g./100 | 0.5 g./100, 20 g./100. | Boiling | Amb.-Boiling | 1 | 0-2 | 25% | 20-30% | 2.5 | 0-5 |
| C | 0.5-10 | 10 g./100 | 0.5 g./100, 20 g./100. | Boiling | Amb.-Boiling | 1 | 0-7 | 1.5 cc./gm. | 1. cc.-2 cc. gm. of metal reduced. | 0 | 0-5 |
| D | 0.5-10 | 10 g./100 | 0.5 g./100, 20 g./100. | Boiling | Amb.-Boiling | 1 | 0-7 | 64% | 60-64% | 2 | 0-5 |

A brief explanation of Table I is believed in order. Each column is divided in two parts. The left part indicates optimum or preferred value. The right part indicates working range. Column 1 is a representative range of surface areas normally desired in fabricating palladium oxide resistors. The surface area is expressed in meters square per gram. Column 2 is an indication for each surface area of the metal solution dilution range as well as the preferred dilution. The dilution is expressed as grams of palladium per cc. of mineral acid. Column 3 is the reaction temperature range and preferred reaction temperautre. As previously indicated, the boiling temperature of the metal-mineral acid solution is preferred because of constancy of reaction when the reductant is added. Column 4 is the pH range and preferred pH of the reaction. The pH reading is obtained by a conventional pH meter with automatic temperature compensation presently available on the commercial market. Since the heat of neutralization raises the temperature of the solution, the use of automatic temperature compensation in pH measurement simplifies the neutralization operation. Column 5 is the reductant concentration range and preferred value in percent. The reductant for rows A, B, and D is hydrazine, whereas the reductant for row C is formic acid. Column 6 is the dispersant range and preferred value in percent of the metal solution indicated in Column 2. The dispersant for the formic acid portion reduced metal was filtered and washed with de-ionized water. The yield of metal is 25 g. (100%). The palladium black was dried at 105° C. for one hour. The palladium black was oxidized in a furnace at 800° C. After cooling, 19% by weight of palladium oxide was combined with 21% by weight of silver, 60% by weight of glass and a finely divided colloidal silica, such that the ratio was 1.5% colloidal silica to 98.5% of the above mixture. The solids were thoroughly mixed in a high speed shaker for about two hours. A vehicle, for example, beta terpineol, was added to the solids whereby the solid concentration was 80%. The mixture was milled in conventional equipment and screened onto a suitable substrate. The product composition was dried at about 100° C. after which firing in a furnace at 750° C. occurred for about 20 minutes. The resultant resistors were of the order of 2 kilo-ohms per square with a TCR of approximately plus 1000 p.p.m. per degree C. The surface area for the palladium oxide was of the order of 3 m.²/g.

*Example II*

Palladium, purchased from a commercial vendor, was combined with nitric acid ($HNO_3$—70% concentrated) to form a solution containing 10 grams of palladium per 100 milliliters of solution. Approximately 225 milliliters of high purity ammonium hydroxide ($NH_4OH$—28% concentrated) per liter of solution was added to neutralize the metal acid solution to a hydrogen ion concentration or pH 1. 300 milliliters of the neutralized solution (25 g./ Pd) was brought to a boil and 37.5 milliliters of 88% high purity formic acid (HCOOH) was added at one time. A reaction occurred after about five minutes. The completion of the reaction was indicated by disappearance of the color. The palladium black was filtered, washed and dried as in Example I. After drying, the palladium black was oxidized at approximately 750° C. in air for about one hour. The oxidized palladium was mixed with lithium carbonate in the ratio of 1:8 grams of lithium per 100 grams of palladium oxide. This combination of lithium carbonate and palladium oxide is fired at about 800° C. The resulting palladium oxide doped with lithium was combined with other elements to form a composition comprising 19% lithium doped palladium oxide, 21% silver, and 60% glass. The composition was distributed in an organic vehicle, the solid content of the composition being approximately 80% of the silicate screened deposition. The deposit resistor was fired at about 800° C. to form resistor elements having resistivities of the order of 50 ohms per square and a TCR of approximately 50 p.p.m. per degree C. The surface area for the palladium oxide was of the order of 1 $m.^2/g.$

*Example III*

Palladium metal, purchased from a commercial vendor, was combined with nitric acid in a solution containing 10 grams of palladium per 100 milliliters of solution. Ammonium hydroxide was added to the solution to realize a pH of 1. 300 milliliters of solution (25 g. Pd) was brought to a boil. Thirty-two percent hydrazine was added to the boiling solution at the rate of 1 cc. per 15 seconds for eight minutes. The precipitated palladium was filtered, washed and dried at 105° C. for one hour. The palladium had a surface area of 18 meters square per gram. The powder was combined with silver of 0.7 meter square per gram. The composition was sifted through a 400 mesh screen. A 400 mesh lead borosilicate glass powder was added to the composition, the metal powder being 98% and the glass being 2% of the total composition by weight. A vehicle was added to the composition and the mixture was passed through a three roll mill to further dispense the pigment in the vehicle. The paste was applied to a ceramic substrate through a silk screen having a 325 mesh size by means of a rubber squeegee. The substrate and paste were fired in an oven at 750° C. The conductor had a conductivity of 0.45 to 1.20 ohms per inch per 15 mils.

Throughout the examples where silver was used, it can be replaced wholly or partly with either gold or platinum or both, with similar results.

While the invention has been particularly shown and described with reference to preferred embodiments thereof, it will be understood by those skilled in the art that various changes in form and detail may be made therein without departing from the spirit and scope of the invention.

What is claimed is:

The method of forming crystallites of a noble metal conductor having a surface area of between 0.5–10 $m^2/gm.$ comprising the steps of:

dissolving a noble metal substantially free of impurities in a nitric acid solution;

adjusting to and maintaining the solution at a pH value of approximately 1 by the addition of ammonium hydroxide;

raising the solution to and maintaining it at boiling temperature; and precipitating the metal crystallites from the solution by the addition of formic acid in the proportion of approximately 1–2 cc. per gm. of metal to obtain crystallites having surface areas falling within the above surface area range.

References Cited

UNITED STATES PATENTS

| | | | |
|---|---|---|---|
| 1,164,141 | 12/1915 | Sulzberger. | |
| 1,426,517 | 8/1922 | Sulzberger. | |
| 2,995,473 | 8/1961 | Levi | 106—1 X |
| 3,052,573 | 10/1962 | Dumesnil | 252—514 X |
| 3,235,392 | 2/1966 | Miles | 106—1 |

LEON D. ROSDOL, *Primary Examiner.*

J. D. WELSH, *Assistant Examiner.*